(12) United States Patent
Li et al.

(10) Patent No.: US 11,053,579 B2
(45) Date of Patent: Jul. 6, 2021

(54) FINE METAL MASK, DISPLAY SUBSTRATE, AND ALIGNMENT METHOD THEREFOR

(71) Applicant: KUNSHAN GO-VISIONOX OPTO-ELECTRONICS CO., LTD., Kunshan (CN)

(72) Inventors: Weili Li, Kunshan (CN); Xuliang Wang, Kunshan (CN); Shuaiyan Gan, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 46 days.

(21) Appl. No.: 16/306,904

(22) PCT Filed: Sep. 20, 2017

(86) PCT No.: PCT/CN2017/102481
§ 371 (c)(1),
(2) Date: Dec. 4, 2018

(87) PCT Pub. No.: WO2018/054306
PCT Pub. Date: Mar. 29, 2018

(65) Prior Publication Data
US 2020/0308687 A1    Oct. 1, 2020

(30) Foreign Application Priority Data

Sep. 23, 2016 (CN) .......................... 201610846761.8

(51) Int. Cl.
*C23C 14/04* (2006.01)
*H01L 23/544* (2006.01)
(Continued)

(52) U.S. Cl.
CPC ............ *C23C 14/042* (2013.01); *C23C 14/24* (2013.01); *H01L 23/544* (2013.01);
(Continued)

(58) Field of Classification Search
None
See application file for complete search history.

(56) References Cited

U.S. PATENT DOCUMENTS

| 2002/0025406 A1* | 2/2002 | Kitazume | ................. B32B 3/10 428/136 |
| 2008/0202421 A1 | 8/2008 | Allen et al. | |

(Continued)

FOREIGN PATENT DOCUMENTS

| CN | 103205694 A | 7/2013 |
| CN | 103695846 A | 4/2014 |

(Continued)

OTHER PUBLICATIONS

International Search Report dated Dec. 26, 2017 in the corresponding PCT application(application No. PCT/CN2017/102481).
(Continued)

*Primary Examiner* — Asok K Sarkar
(74) *Attorney, Agent, or Firm* — Kilpatrick Townsend & Stockton

(57) ABSTRACT

A fine metal mask (100) comprising a pattern region (110) comprising a plurality of openings; and a plurality of alignment holes (120) located outside the pattern region (110). Also disclosed are a display substrate (200) and an alignment method for the fine metal mask (100) for evaporation.

17 Claims, 9 Drawing Sheets

(51) Int. Cl.
*C23C 14/24* (2006.01)
*H01L 51/00* (2006.01)
*H01L 51/56* (2006.01)

(52) U.S. Cl.
CPC ...... *H01L 51/0011* (2013.01); *H01L 51/0096* (2013.01); *H01L 51/56* (2013.01); *H01L 2223/54426* (2013.01)

(56) References Cited

U.S. PATENT DOCUMENTS

| 2010/0080915 | A1 | 4/2010 | Masuda et al. |
| 2012/0149329 | A1 | 6/2012 | Mahmood et al. |
| 2014/0033974 | A1 | 2/2014 | Hong et al. |
| 2017/0194563 | A1 | 7/2017 | Li |

FOREIGN PATENT DOCUMENTS

| CN | 105549320 | A | 5/2016 |
| CN | 206015074 | U | 3/2017 |
| EP | 1426461 | A1 | 6/2004 |
| EP | 2692896 | A1 | 2/2014 |
| JP | 2005158477 | A | 6/2005 |
| JP | 2006114402 | A | 4/2006 |
| JP | 2012149329 | A | 8/2012 |
| JP | 2014031582 | A | 2/2014 |
| JP | 2015127458 | A | 7/2015 |

OTHER PUBLICATIONS

European Search Report dated Aug. 2, 2019 in the corresponding EP application (application No. 17852374.2).
International Search Report and Written Opinion of the International Searching Authority dated Dec. 26, 2017 in the corresponding International application (application No. PCT/CN2017/102481).
Office Action of Japanese Patent Application No. 2019-510363.
Office Action of Korean Patent Application No. 10-2019-7004990.
Office Action of Taiwan Patent Application No. 106132557.
Notice of Allowance of Korean Patent Application No. 10-2019-7004990.

* cited by examiner

FINE METAL MASK, DISPLAY SUBSTRATE, AND ALIGNMENT METHOD THEREFOR

FILED

The present disclosure relates to the field of evaporation technology, particularly to a fine metal mask, a display substrate and an alignment method thereof.

BACKGROUND

Currently, in the process of making an organic material layer of display panel such as OLED (Organic Light-Emitting Diode) display screen, the organic material layer with required patterns is formed on the OLED substrate masked by a mask plate with patterns by vacuum evaporation. The pattern region of the mask plate has a plurality of openings through which organic materials are plated onto the pixel region of the OLED substrate during evaporation, thereby pixels made of organic materials are formed in the pixel region. In order to form pixels of different colors on the OLED substrate, mask plates with different patterns need to be used. For example, in order to form pixels of three colors of red, green and blue on the OLED substrate, it is necessary to form red pixels on the OLED substrate using a mask plate having red pixel patterns, to form green pixels on the OLED substrate using a mask plate having green pixel patterns, and to form blue pixels on the OLED substrate using a mask plate having blue pixel patterns. The mask plate includes a mask and a mesh frame, and the mask need to be tensioned on the mesh frame by a tension device when it is combined with the mesh frame (referred to as tension operation), so the mask is fixed on the mesh frame to form a required mask plate.

During the evaporation process of the organic material layer, it is necessary to debug the PPA (Pixel Position Accuracy) of the fine metal mask and realize accurate alignment between the fine metal mask and the substrate during this process, thereby normal debugging of the PPA is ensured. In the actual operation, it is difficult to realize precise alignment.

SUMMARY

Based on this, the present application provides a fine metal mask for evaporation, a display substrate and an alignment method thereof, which improve alignment accuracy.

According to an aspect of the present disclosure, there is provided a fine metal mask comprising a pattern region including a plurality of openings and a plurality of alignment holes located outside the pattern region.

In the fine metal mask according to the aspect, since the alignment holes are located outside the pattern region, the alignment holes are easily identified when the fine metal mask is tensioned, so it is tensioned on the mesh frame using a tension device, and the alignment holes also contribute to the accurate alignment between the fine metal mask and the OLED substrate, thereby the yield of the product obtained by evaporation is improved.

In one embodiment, the pattern region has a circular shape, and the plurality of alignment holes are evenly distributed along the circumferential direction of the pattern region.

The plurality of alignment holes serve as a tension position reference when the fine metal mask is tensioned on the mesh frame, and since the plurality of alignment holes are evenly distributed along the circumferential direction of the pattern region, so that the fine metal mask can be positioned more accurately and stabilized on the mesh frame easily.

In one embodiment, the number of the plurality of alignment holes is at least three.

In one embodiment, the plurality of alignment holes have the same shape and size as that of the plurality of openings in the pattern region.

Since the alignment holes and the openings in the pattern region of the fine metal mask have the same shape and size, the alignment holes and the openings in the pattern region of the fine metal mask can be opened by using the same opening mold when making the fine metal mask, which is convenient to operate.

In one embodiment, the plurality of alignment holes have the same arrangement as that of the plurality of openings in the pattern region.

Since the plurality of alignment holes and the plurality of openings in the pattern region of the above fine metal mask have the same arrangement, the alignment holes can be opened according to the opening manner of the openings in the pattern region when making the fine metal mask.

According to another aspect of the present disclosure, there is provided a display substrate adapted to cooperate with the above fine metal mask during evaporation. The display substrate comprises a pixel region corresponding to the pattern region in the fine metal mask and a plurality of alignment marks located outside the pixel region, and the position of each alignment mark in the display substrate corresponds to the position of the corresponding one of the plurality of alignment holes in the fine metal mask;

In one embodiment, the alignment marks are alignment fitting holes.

In one embodiment, the opening size of the alignment fitting holes is smaller than that of the alignment holes, so that the alignment fitting holes are visible through the openings of the alignment holes when the fine metal mask is placed on the display substrate and the alignment fitting holes are aligned with the alignment holes.

Since the opening size of the alignment fitting holes is smaller than that of the alignment holes, the alignment fitting holes are visible through the openings of the alignment holes when the alignment fitting holes are aligned with the alignment holes, thus when the fine metal mask is aligned with the display substrate and the PPA debugging of the fine metal mask is performed, the alignment fitting holes in the display substrate can be easily identified through the openings of the alignment holes in the fine metal mask, thereby the relative position between the fine metal mask and the display substrate is adjusted to complete the alignment.

According to still another aspect of the present disclosure, there is provided an alignment method of a fine metal mask for evaporation comprising the following steps:

providing a fine metal mask which includes a pattern region including a plurality of openings and a plurality of alignment holes located outside the pattern region;

identifying the plurality of alignment holes in the fine metal mask, and tensioning the fine metal mask on the mesh frame using a tension device according to the identified alignment holes, and a mask plate is formed by the fine metal mask and the mesh frame;

providing a display substrate which includes a pixel region and a plurality of alignment marks, wherein the pixel region corresponds to the pattern region in the fine metal mask, and the position of each of the plurality of alignment marks in the display substrate corresponds to the position of the corresponding one of the plurality of alignment holes in the fine metal mask;

placing the mask plate on the display substrate, and adjusting the position of the fine metal mask so that the plurality of alignment holes in the fine metal mask are aligned with the position of the corresponding one of the plurality of alignment marks in the display substrate, respectively; and performing evaporation for the assembly consisting of the mask plate and the display substrate using an evaporation source.

In the above alignment method of the fine metal mask for evaporation, the used fine metal mask has a plurality of alignment holes outside the pattern region which are independent of the pattern region and thus can be easily identified, thereby the alignment accuracy between the fine metal mask and the display substrate is ensured and the yield of the product is improved.

In one embodiment, the method comprises providing a plurality of fine metal masks, wherein the pattern region in each fine metal mask has different pixel pattern, and each fine metal mask is used to form pixels of single color on the display substrate during evaporation.

In one embodiment, the alignment marks on the display substrate are alignment fitting holes.

In one embodiment, the size of the alignment marks is smaller than the opening size of the alignment holes, so that the alignment marks are visible through the openings of the alignment holes when the alignment marks are aligned with the alignment holes.

In one embodiment, adjusting the position of the fine metal mask so that the plurality of alignment holes in the fine metal mask are aligned with the position of the corresponding one of the plurality of alignment marks in the display substrate respectively comprises: adjusting the position of the fine metal mask so that each of the plurality of alignment marks in the display substrate is located at the central position of the opening of the corresponding one of the plurality of alignment holes in the fine metal mask.

In the alignment method of the fine metal mask for evaporation, a fine metal mask having alignment holes provided outside the pattern region and a display substrate having alignment marks provided outside the pixel region are used, and the fine metal mask can be tensioned at a correct position on the mesh frame by identifying the alignment holes of the fine metal mask, and the accurate positioning of the fine metal mask and the display substrate can be realized by aligning the positions of the alignment holes of the fine metal mask and the alignment marks of the display substrate, thereby the yield of the product obtained by evaporation is improved.

DETAILED DESCRIPTION OF THE EMBODIMENTS

Reference will be made to the drawings to describe embodiments of the present disclosure in detail, so that the above objects, features and advantages of the present disclosure can be more apparent and understandable. In the following description, numerous specific details are set forth in order to provide a thorough understanding of the present disclosure. However, the present disclosure can be implemented in many other ways than those described herein, and those skilled in the art can make similar improvements without departing from the spirit of the disclosure. Therefore, the present disclosure is not limited to the specific embodiments disclosed below.

For convenience of explanation, the evaporation of the OLED substrate is described below as an example, and it can be understood by those skilled in the art that the fine metal mask and the alignment method of the present disclosure can be applied to other suitable types of display substrates.

Figure 1:
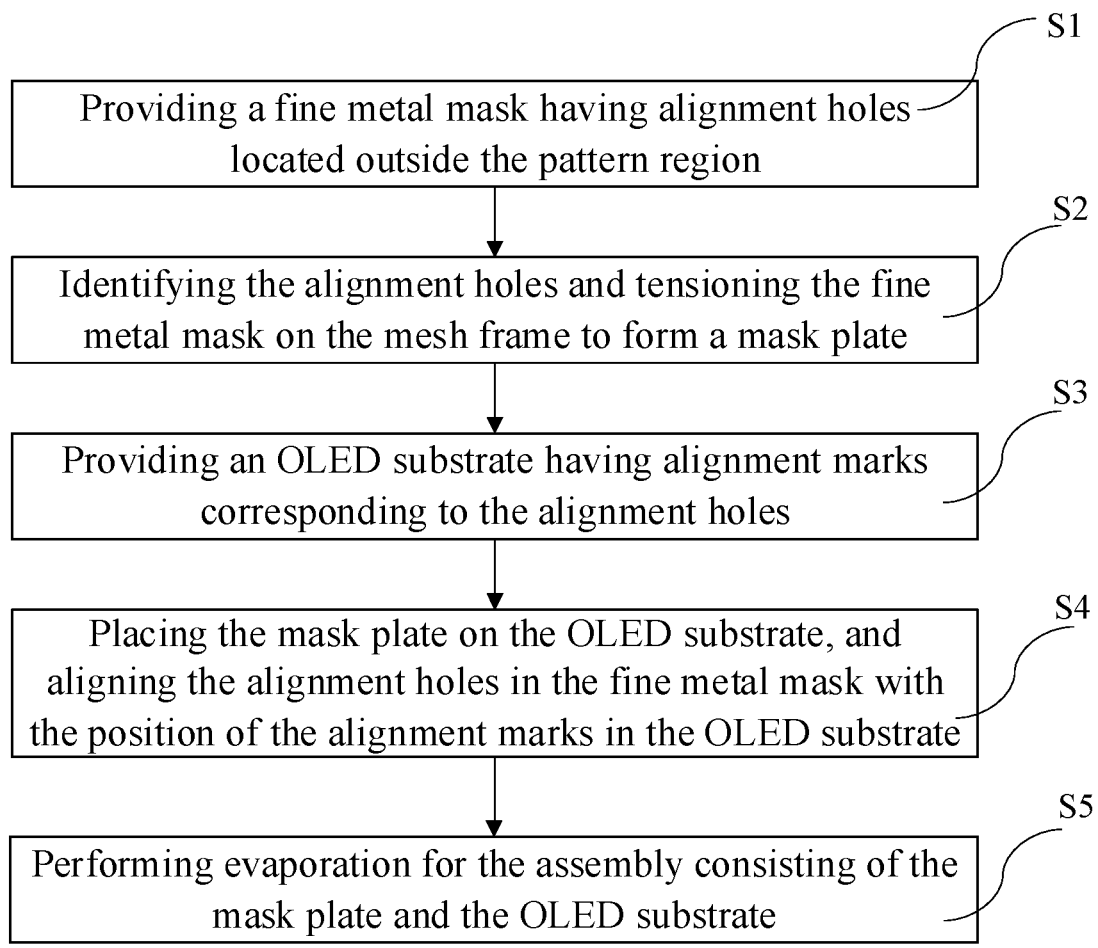
FIG. 1 is a flowchart of the alignment method of the fine metal mask for OLED evaporation according to one embodiment of the present disclosure.

As shown in FIG. 1, the present disclosure provides an alignment method of a fine metal mask for evaporation comprising the following steps:

S1: Providing a fine metal mask which includes a pattern region including a plurality of openings and a plurality of alignment holes located outside the pattern region;

S2: Identifying the plurality of alignment holes in the fine metal mask, and tensioning the fine metal mask on the mesh frame using a tension device according to the identified alignment holes, and a mask plate is formed by the fine metal mask and the mesh frame;

S3: Providing an OLED substrate which includes a pixel region and a plurality of alignment marks, wherein the pixel region corresponds to the pattern region in the fine metal mask, and the position of each of the plurality of alignment marks in the OLED substrate corresponds to the position of the corresponding one of the plurality of alignment holes in the fine metal mask;

S4: Placing the mask plate on the OLED substrate, and adjusting the position of the fine metal mask so that the plurality of alignment holes in the fine metal mask are aligned with the position of the corresponding one of the plurality of alignment marks in the OLED substrate, respectively;

S5: Performing evaporation for the assembly consisting of the mask plate and the OLED substrate using an evaporation source.

The method further comprises providing a plurality of fine metal masks, wherein the pattern region in each fine metal mask has different pixel pattern, and each fine metal mask is used to form pixels of single color on the OLED substrate during evaporation. Taking an OLED substrate having three color pixels of red (R), green (G) and blue (B) as an example, the above method needs to provide three fine metal masks which are separately used to form red, green and blue pixels on the OLED substrate during evaporation. Hereinafter, the fine metal mask of the present disclosure will be described in detail.

Figure 2:
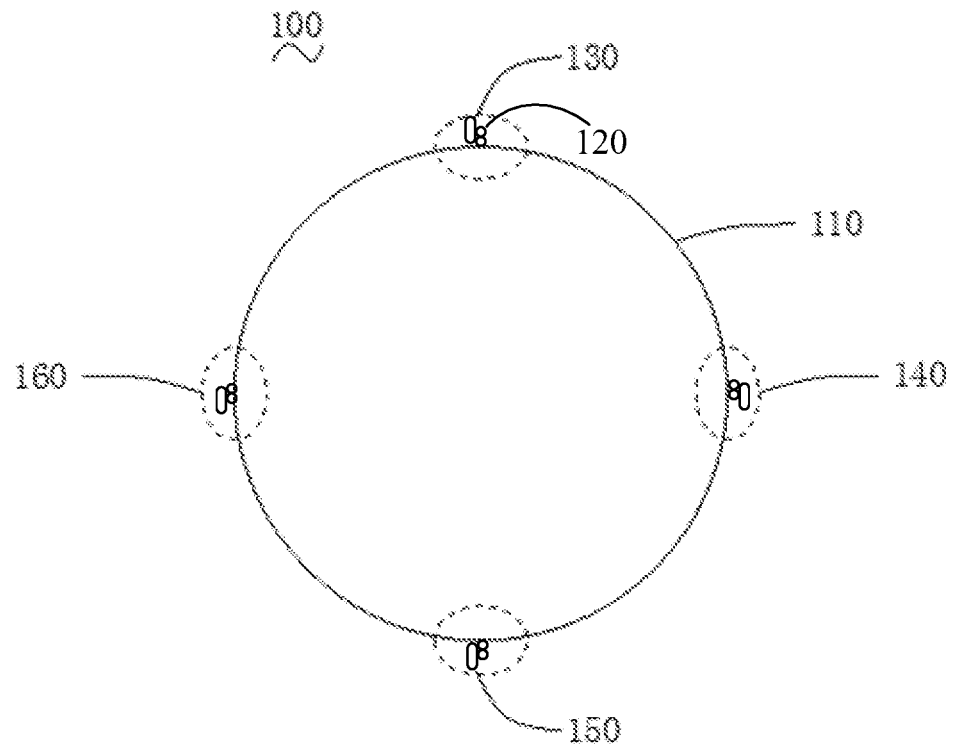
FIG. 2 is a schematic top view of the fine metal mask according to one embodiment of the present disclosure.
Figure 3:
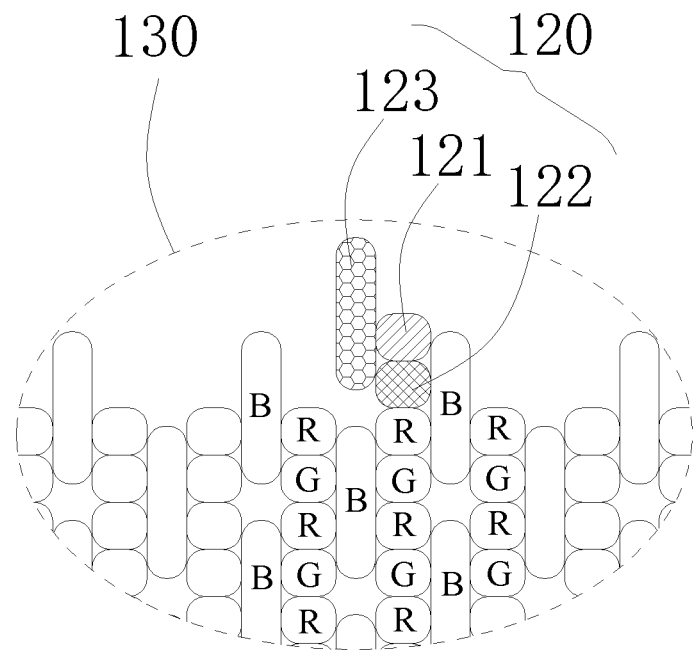
FIG. 3 is a schematic enlarged view of the first position of the fine metal mask shown in FIG. 2.
Figure 4:
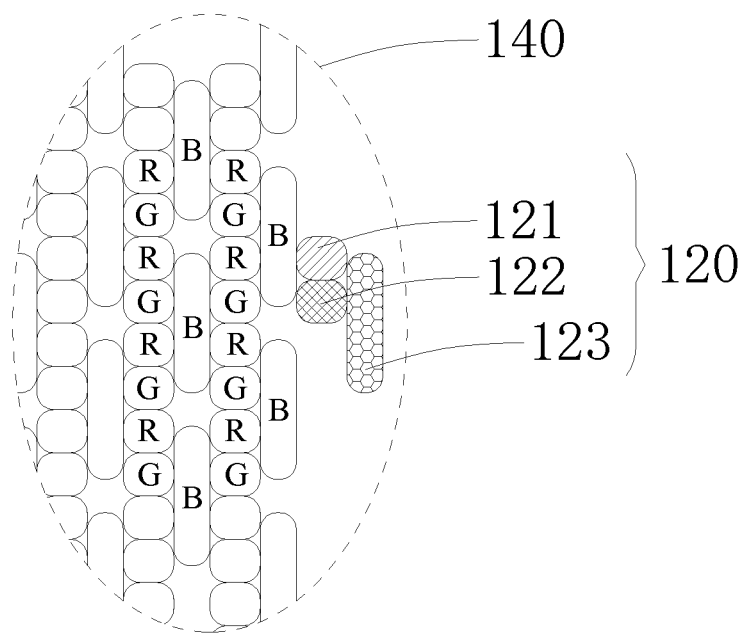
FIG. 4 is a schematic enlarged view of the second position of the fine metal mask shown in FIG. 2.
Figure 5:
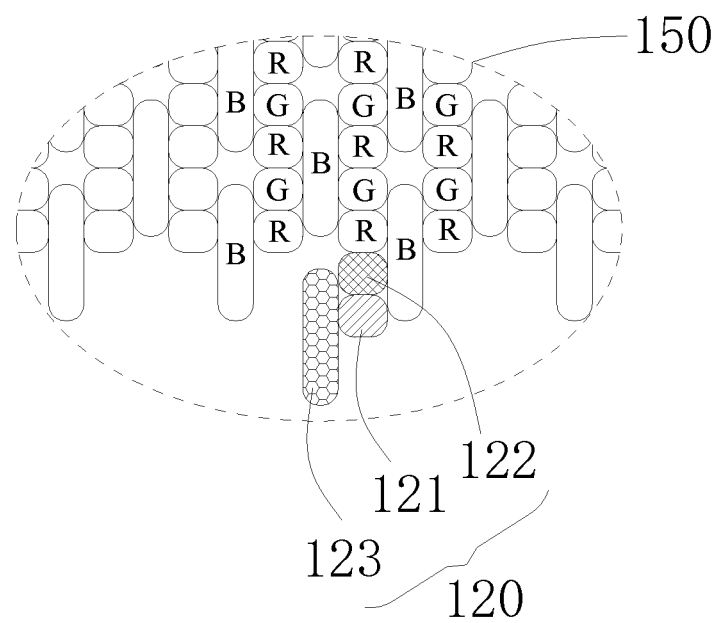
FIG. 5 is a schematic enlarged view of the third position of the fine metal mask shown in FIG. 2.
Figure 6:
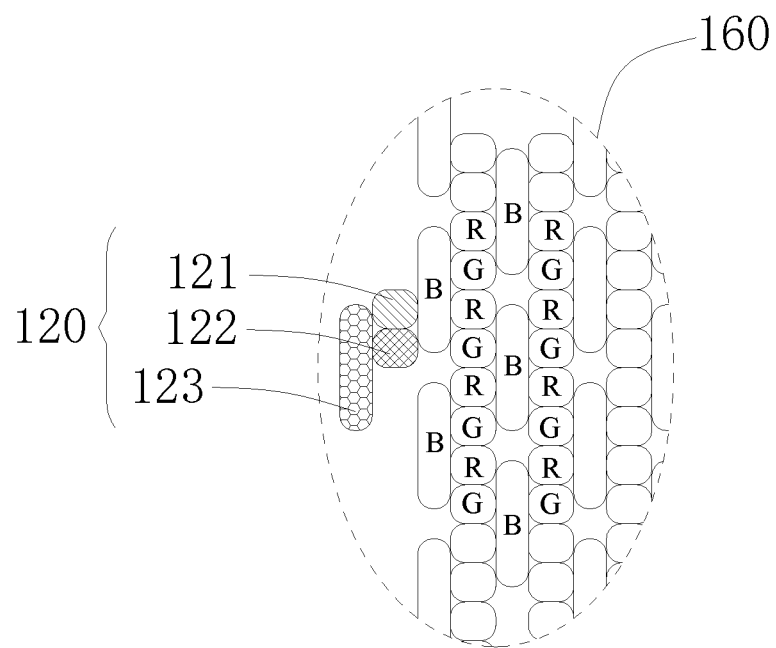
FIG. 6 is a schematic enlarged view of the fourth position of the fine metal mask shown in FIG. 2.

FIG. 2 shows a fine metal mask 100 according to one embodiment of the present disclosure. The fine metal mask 100 comprises a pattern region 110 and a plurality of alignment holes 120 located outside the pattern region 110. In the embodiment, the pattern region 110 of the fine metal mask 100 has a circular shape, and the alignment holes 120 are evenly distributed along the circumferential direction of the pattern region 110. As shown in FIG. 2, there are four circumferentially evenly distributed positions on the outer circumference of the pattern region 110, i.e., a first position 130, a second position 140, a third position 150 and a fourth position 160. The four positions are provided with alignment holes 120, respectively. As shown in FIG. 3-6, the alignment holes 120 comprise three types of alignment holes, such as R alignment hole 121 for evaporating R pixels, G alignment hole 122 for evaporating G pixels, and B alignment hole 123 for evaporating B pixels. For convenience of explanation, in the embodiment, the pattern regions for evaporating the three RGB color pixels are simultaneously shown in FIGS. 3-6, and the R alignment hole 121, the G alignment hole 122 and the B alignment hole 123 also appear simultaneously. However, according to the relevant knowledge of those skilled in the art, in fact, for one fine metal mask 100, there is usually only a pattern region of one color pixel and an alignment hole corresponding to the color pixel. That is, the R alignment hole 121 exists only in the fine metal mask for evaporating the R pixel, the G alignment hole 122 exists only in the fine metal mask for evaporating the G pixel, and the B alignment hole 123 exists only in the fine metal mask for evaporating the B pixel. All schematic drawings of the present disclosure are therefore only for illustrative purposes and do not represent actual cases.

The pattern region 110 is used to form a pixel region on the OLED substrate during evaporation, and the pixel region will finally be formed as an effective display region on the display screen. There are a plurality of openings on the pattern region 110, as shown in FIGS. 2-5. Organic materials are deposited on the pixel region of the OLED substrate through these openings during evaporation, thereby pixels composed of the organic materials are formed in the pixel region. In the embodiment, the pattern region 110 has a circular shape. Certainly, the shape of the pattern region 110 is not limited thereto, and it can be understood by those skilled in the art that the pattern region may be any suitable shape as desired, such as a triangle, a rectangle, a square, or other polygons, or an ellipse, an ellipse-like shape, or the like.

Figure 7:
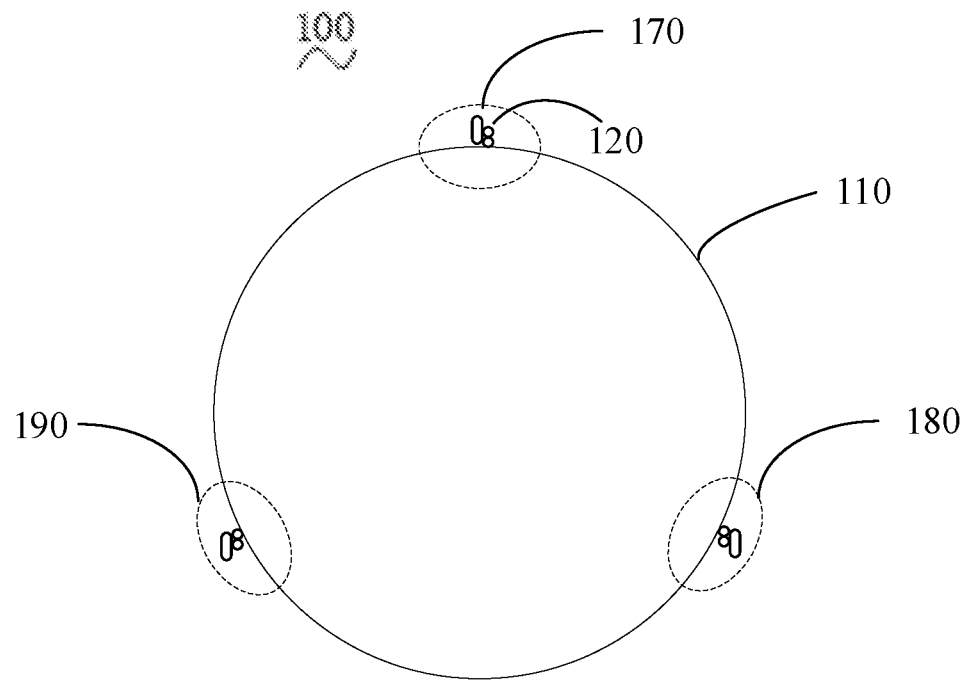
FIG. 7 is a schematic top view of the fine metal mask according to another embodiment of the present disclosure.

In the embodiment, the plurality of alignment holes 120 of the fine metal mask 100 are evenly distributed along the circumferential direction of the pattern region 110. The plurality of alignment holes 120 serve as a tension position reference when the fine metal mask is tensioned on the mesh frame, and since these alignment holes 120 are evenly distributed along the circumferential direction of the pattern region 110 to form positioning reference points spaced apart from each other, the fine metal mask can be positioned on the mesh frame more accurately and stabilized on the mesh frame easily. In the embodiment, the number of the alignment holes is four. In other embodiments, the number of the alignment holes may be set to three, five, or more than five as desired. It will be understood by those skilled in the art that the plane of the fine metal mask can be determined by three alignment holes, and therefore the number of alignment holes is preferably set to at least three. For example, FIG. 7 shows a schematic top view of the fine metal mask according to another embodiment of the present disclosure. In this embodiment, three alignment holes 120 are provided outside the pattern region 110 of the fine metal mask 100 (as described above, for convenience of explanation, the R alignment hole, the G alignment hole and the B alignment hole are simultaneously shown in this embodiment). Specifically, alignment holes 120 are respectively provided at three positions 170, 180 and 190 evenly distributed along the circumferential direction of the circular pattern region 110.

Still referring to FIGS. 3-6, the plurality of alignment holes 120 of the fine metal mask 100 are adjacent to the pattern region 110. The alignment holes are disposed adjacent to the pattern region, and the area of the identification region may be reduced when the alignment hole is identified. It can be understood by those skilled in the art that the alignment holes may be spaced apart from the pattern region, so that it is easy to effectively distinguish the alignment holes from the pattern region when the alignment holes are identified, but spacing distance should not be too large, or it would result in an excessively large identification region.

As shown in FIGS. 3-6, in the alignment holes 120 of the embodiment, the R alignment hole 121 and the G alignment hole 122 present a square whose apex angles are rounded corners, and the B alignment hole 123 presents a closed pattern with arc, preferably semi-circular shapes at two ends and a rectangle in the middle. In the embodiment, the R alignment hole 121, the G alignment hole 122 and the B alignment hole 123 have the same shape and size as that of the openings of the corresponding color pixels in the pattern region, thus, the alignment holes and the openings in the pattern region of the fine metal mask can be opened by using the same opening mold when making the fine metal mask, which is convenient to operate. Furthermore, in the embodiment, the alignment holes and the openings in the pattern region of the fine metal mask have the same arrangement, so that the alignment holes can be opened according to the opening manner of the openings in the pattern region when making the fine metal mask. It can be understood by those skilled in the art that the shape and size of the alignment holes may be different from that of the openings in the pattern region, so that it is easy to effectively distinguish the alignment holes from the pattern region when the alignment holes are identified.

Figure 8:
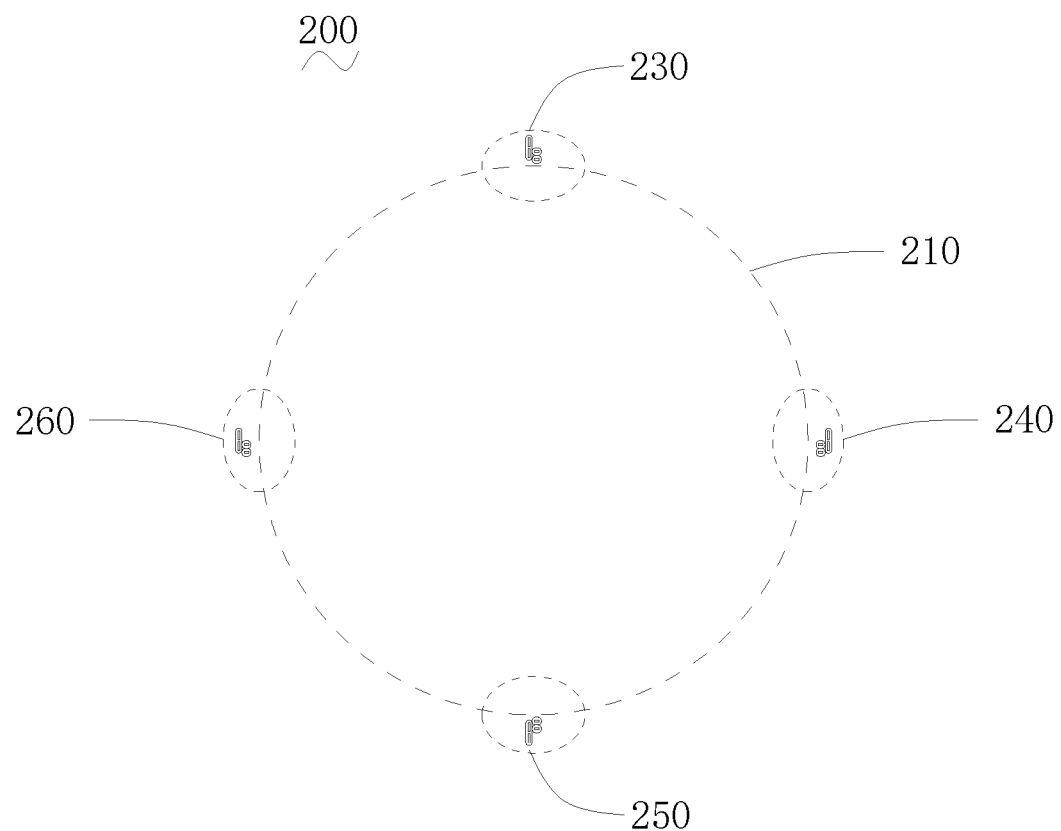
FIG. 8 is a schematic bottom view of the OLED substrate according to one embodiment of the present disclosure.
Figure 9:
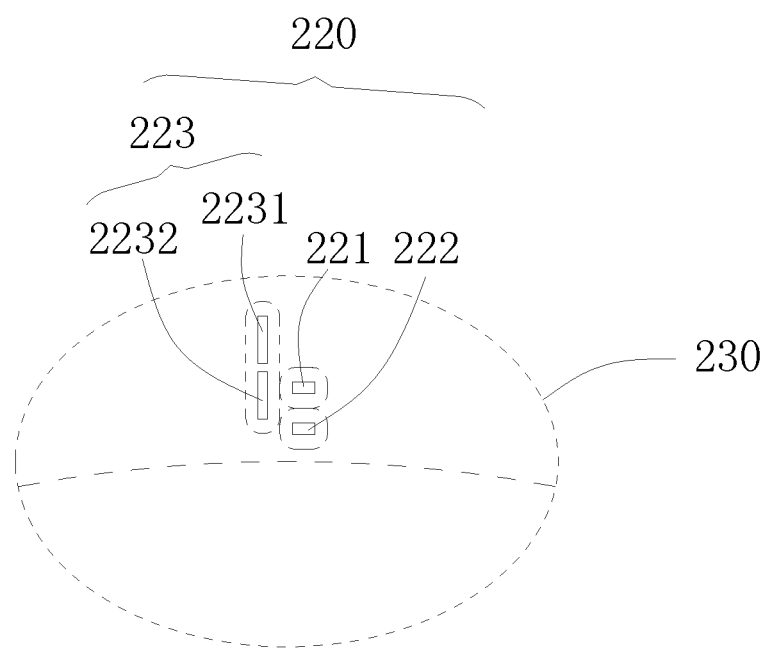
FIG. 9 is a schematic enlarged view of the first position of the OLED substrate shown in FIG. 8.
Figure 10:
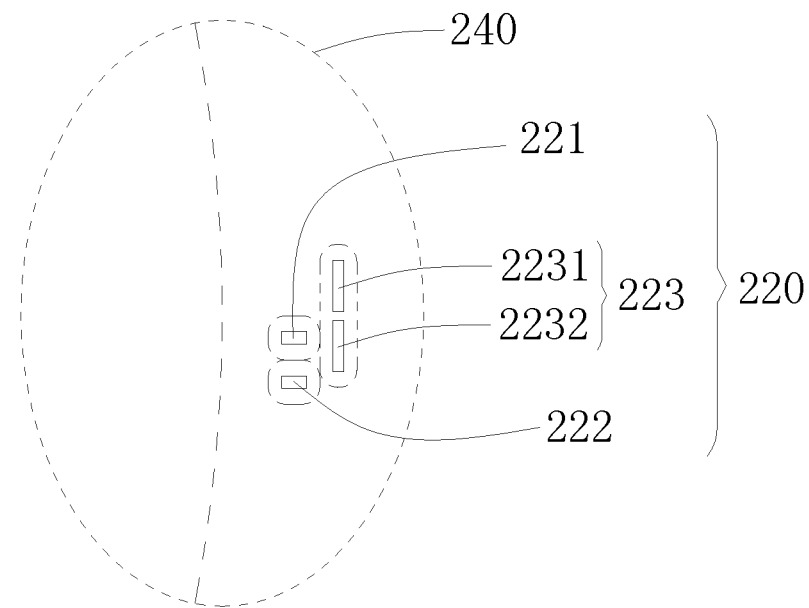
FIG. 10 is a schematic enlarged view of the second position of the OLED substrate shown in FIG. 8.
Figure 11:
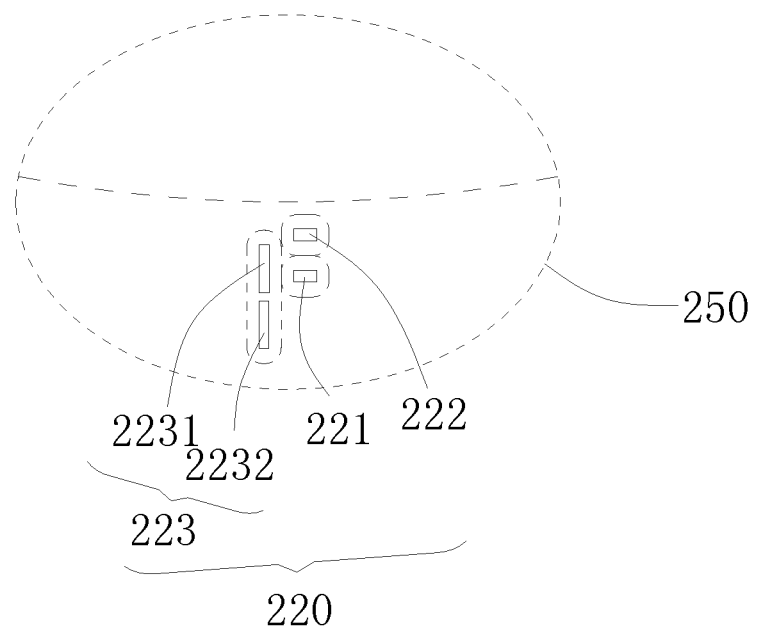
FIG. 11 is a schematic enlarged view of the third position of the OLED substrate shown in FIG. 8.
Figure 12:
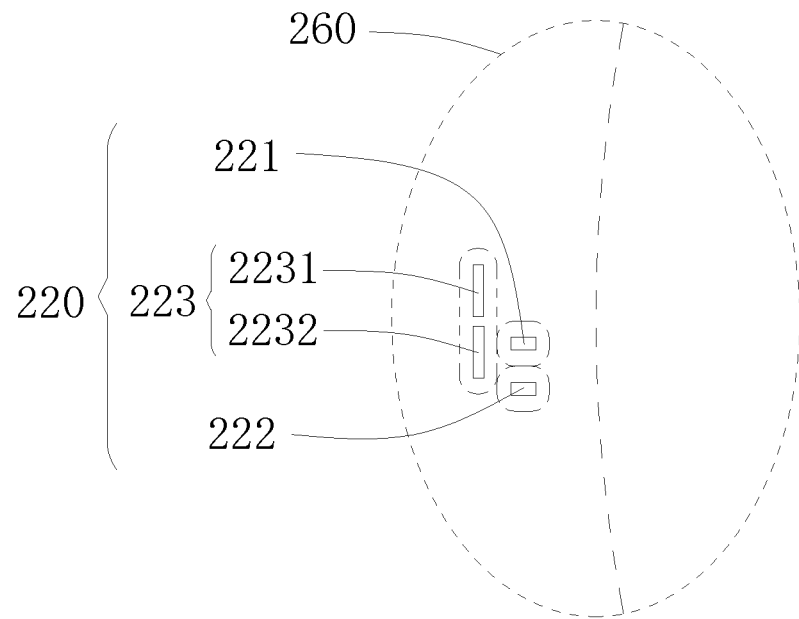
FIG. 12 is a schematic enlarged view of the fourth position of the OLED substrate shown in FIG. 8.

FIG. 8 shows an OLED substrate 200 according to one embodiment of the present disclosure. The OLED substrate 200 has a pixel region 210 corresponding to the pattern region 110 on the fine metal mask 100 and four alignment marks disposed corresponding to the alignment holes 120 in the fine metal mask 100. The pixel region 210 will form an effective display region of the display. As shown in FIGS. 9-12, the alignment marks in the embodiment are alignment fitting holes 220. The four alignment fitting holes 220 are respectively located at a first position 230, a second position 240, a third position 250 and a fourth position 260 evenly distributed along the circumferential direction of the pixel region 210 on the OLED substrate 200. Certainly, the alignment marks may also be other types of marks that can function as a precise alignment.

As shown in FIGS. 9-12, in the present embodiment, the R alignment fitting hole 221, the G alignment fitting hole 222, the first B alignment fitting hole 2231 and the second B alignment fitting hole 2232 all have a rectangular shape similar to the opening shape of the alignment holes. Certainly, the shape of the alignment fitting hole 220 in the OLED substrate 200 of the present disclosure is not limited thereto, and may also be significantly different from the shape of the alignment hole 120 in the fine metal mask 100, or any other shape.

The opening size of the alignment fitting holes 220 is smaller than the opening size of the alignment holes 120 in the fine metal mask 100, so that the alignment fitting holes 220 are visible through the openings of the alignment holes 120 when the alignment fitting holes 220 are aligned with the alignment holes 120.

Since the opening size of the alignment fitting holes is smaller than that of the alignment holes the alignment fitting holes are visible through the openings of the alignment holes when the alignment fitting holes are aligned with the alignment holes, thus when the fine metal mask is aligned with the OLED substrate and the PPA debugging of the fine metal mask is performed, the alignment fitting holes in the OLED substrate can be easily identified through the openings of the alignment holes in the fine metal mask, thereby the relative position between the fine metal mask and the OLED substrate is adjusted to complete the alignment. In the embodiment, the position of the fine metal mask needs to be adjusted after the fine metal mask is placed on the OLED substrate, so that all the alignment fitting holes in the OLED substrate are located in the central positions of the openings of the alignment holes in the fine metal mask.

In the embodiment, the number of the alignment fitting holes 220 and that of the alignment holes 120 is the same, and the positions are in one-to-one correspondence, thereby the alignment accuracy between the OLED substrate 200 and the fine metal mask 100 is improved.

In the embodiment, the alignment fitting hole 220 includes an R alignment fitting hole 221, a G alignment fitting hole 222 and a B alignment fitting hole 223 corresponding to the R alignment hole 121, the G alignment hole 122 and the B alignment hole 123, respectively. In the embodiment, since the B pixel is an elongated rectangle, and the B alignment hole 123 having the same shape as the B pixel in the fine metal mask 100 is also substantially an elongated rectangle, thus in order to improve the accuracy alignment between the B alignment hole 123 and the B alignment mark, the B alignment mark is designed to have a first B alignment fitting hole 2231 and a second B alignment fitting hole 2232 arranged along the length direction of the B alignment mark. Thus, during the PPA debugging, the degree of position alignment between the B alignment hole and the B alignment mark can be determined more accurately by adjusting the position relationship between the upper half part of the B alignment hole 123 and the first B alignment fitting hole 2231 and the position relationship between the lower half part of the B alignment hole 123 and the second B alignment fitting hole 2232, respectively.

Figure 13:
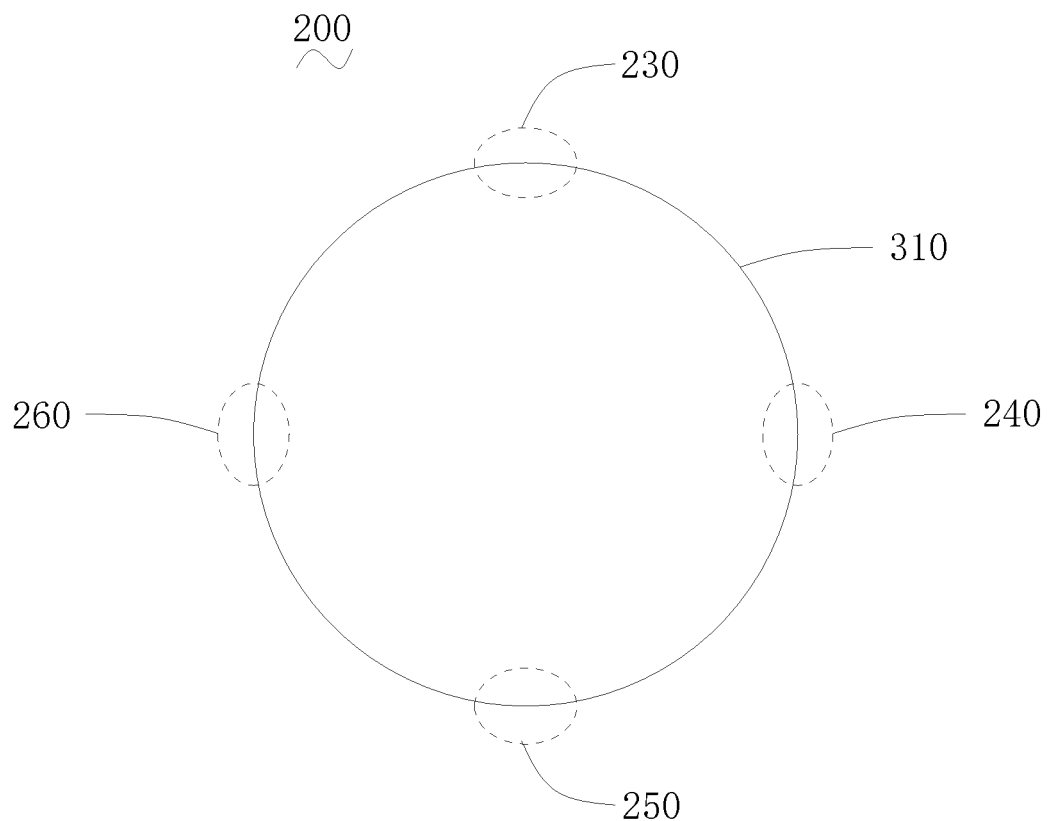
FIG. 13 is a schematic bottom view of an evaporated OLED substrate according to one embodiment of the present disclosure.

FIG. 13 shows a schematic bottom view of the OLED substrate 200 obtained by evaporation after the fine metal mask and the OLED substrate are aligned and combined. FIGS. 14-17 are schematic enlarged views of four positions of the OLED substrate 200, namely, a first position 230, a second position 240, a third position 250, and a fourth position 260, respectively. The evaporated OLED substrate 200 includes a pixel region 310 coated with an organic material layer and an alignment region located outside the pixel region 310. Wherein, the alignment region includes an R alignment region 231, a G alignment region 232 and a B alignment region 233.

Figure 14:
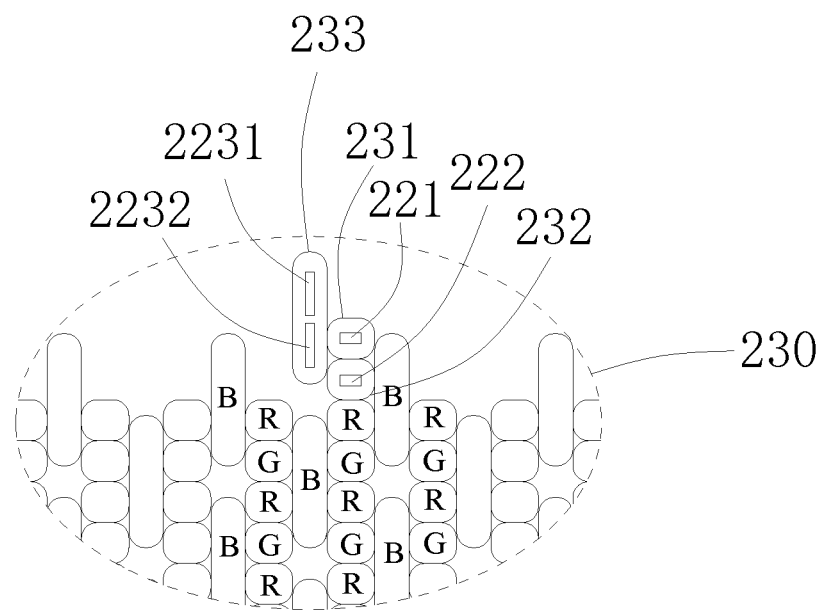
FIG. 14 is a schematic enlarged view of the first position of the evaporated OLED substrate shown in FIG. 13.
Figure 15:
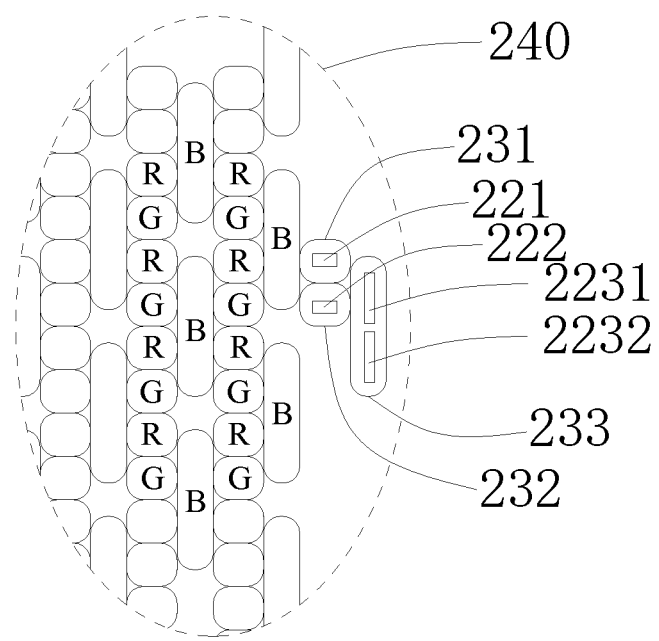
FIG. 15 is a schematic enlarged view of the second position of the evaporated OLED substrate shown in FIG. 13.
Figure 16:
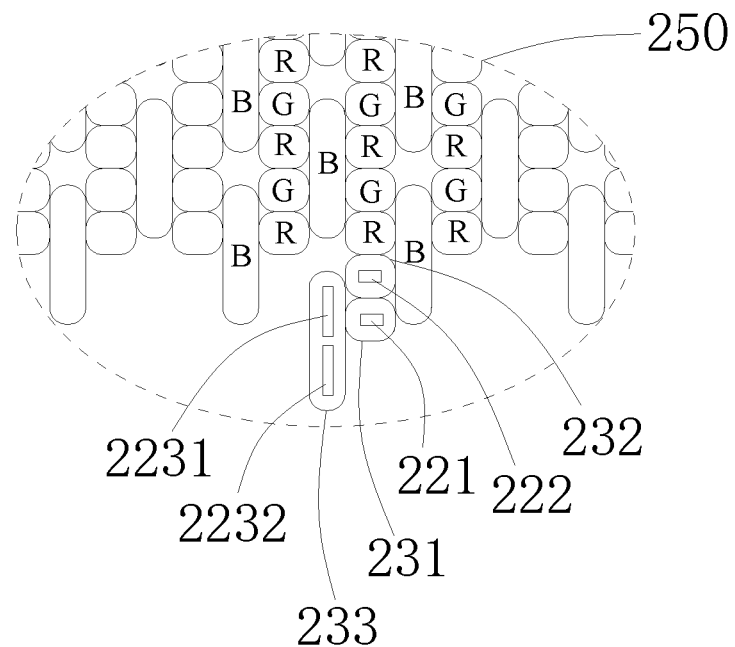
FIG. 16 is a schematic enlarged view of the third position of the evaporated OLED substrate shown in FIG. 13.
Figure 17:
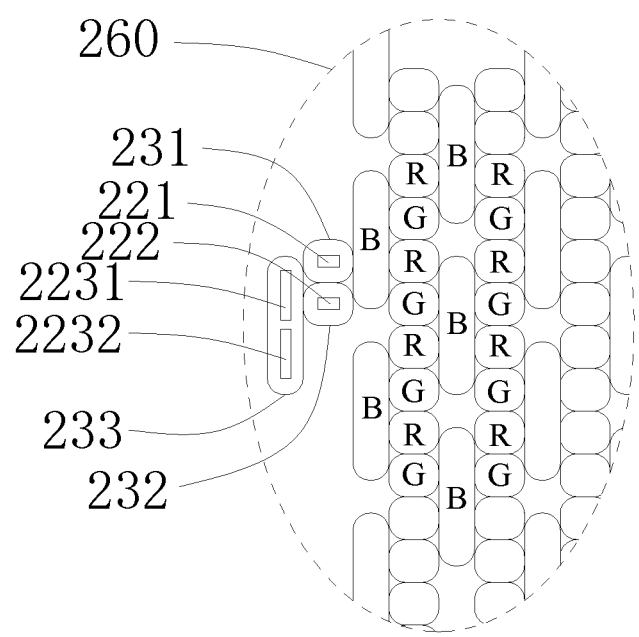
FIG. 17 is a schematic enlarged view of the fourth position of the evaporated OLED substrate shown in FIG. 13.

Referring to FIG. 14, the first position 230 will be described as an example. As described above, in the embodiment, since the opening size of the alignment fitting holes of the OLED substrate is smaller than that of the alignment holes of the fine metal mask, and the alignment fitting holes of the OLED substrate are located at the central positions of the alignment holes of the fine metal mask during alignment, the thickness of the organic materials at the positions where the alignment fitting hole are located in the opening region of the alignment hole is thicker than that at other positions in the opening region of the alignment hole after evaporation. In this way, the relative position between the alignment holes and the alignment fitting holes during the evaporation can be easily determined in the alignment region of the evaporated OLED substrate. For example, the position of the R alignment fitting hole 221 can be identified in the R alignment region 231 formed by the opening of the R alignment hole, and the position of the G alignment fitting hole 222 can be identified in the G alignment region 232 formed by the opening of the G alignment hole, and the positions of the first B alignment fitting hole 2231 and the second B alignment fitting hole 2232 can be identified in the B alignment region 233 formed by the opening of the B alignment hole. The position relationship of the alignment fitting hole with respect to the opening of the alignment hole can be used as the reference of PPA debugging. For example, if the position of the R alignment fitting hole 221 deviates from the center of the R alignment region 231, it is necessary to adjust the position of the fine metal mask with respect to the OLED substrate during the next evaporation, so that the R alignment fitting hole 221 is located at the central position of the opening of the R alignment hole, i.e., the R alignment fitting hole 221 is axially aligned with the R alignment hole.

The technical features of the above-described embodiments may be combined arbitrarily. To simplify the description, all the possible combinations of the technical features in the above embodiments are not described. However, all of the combinations of these technical features should be considered as within the scope of the present disclosure, as long as such combinations do not contradict with each other.

The above-described embodiments merely represent several embodiments of the present disclosure, and the description thereof is more specific and detailed, but it should not be construed as limiting the scope of the present disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

The invention claimed is:

1. A fine metal mask comprising:
   a pattern region including a plurality of openings; and a plurality of alignment holes located outside the pattern region,
wherein the plurality of alignment holes comprises:
a R alignment hole for evaporating red pixel,
a G alignment hole for evaporating green pixel, and
a B alignment hole for evaporating blue pixel,
wherein the R alignment hole and the G alignment hole are disposed side by side in a first direction, and the B alignment hole is disposed at a same side of the R alignment hole and the G alignment hole in the first direction.

2. The fine metal mask of claim 1, wherein the pattern region has a circular shape, and the plurality of alignment holes are evenly distributed along the circumferential direction of the pattern region.

3. The fine metal mask of claim 1, wherein the number of the plurality of alignment holes is at least three.

4. The fine metal mask of claim 1, wherein the plurality of alignment holes have the same shape and size as that of the plurality of openings in the pattern region.

5. The fine metal mask of claim 1, wherein the plurality of alignment holes have the same arrangement as that of the plurality of openings in the pattern region.

6. A display substrate adapted to cooperate with the fine metal mask of claim 1 during evaporation, comprising:
a pixel region corresponding to the pattern region in the fine metal mask; and
a plurality of alignment marks located outside the pixel region, and the position of each of the alignment marks in the display substrate corresponds to the position of a corresponding one of the plurality of alignment holes in the fine metal mask.

7. The display substrate of claim 6, wherein the alignment marks are alignment fitting holes.

8. The display substrate of claim 7, wherein the opening size of the alignment fitting holes is smaller than the opening size of the alignment holes.

9. The display substrate of claim 6, wherein the plurality of alignment marks comprises a blue alignment mark aligned with the third alignment hole, wherein the blue alignment mark comprises:
a first alignment fitting hole and a second alignment fitting hole arranged along a length direction of the blue alignment mark.

10. The fine metal mask of claim 1, wherein the R alignment hole comprises a shape of a rounded square or an ellipse.

11. The fine metal mask of claim 1, wherein the G alignment hole comprises a shape of a rounded square or an ellipse.

12. The fine metal mask of claim 1, wherein the B alignment hole comprises a shape with an arc shape at both ends thereof and a rectangular closed pattern in the middle thereof.

13. The fine metal mask of claim 1, wherein the plurality of alignment holes are adjacent to the pattern region.

14. An alignment method of a fine metal mask for evaporation comprising the following steps:
providing a fine metal mask which includes a pattern region including a plurality of openings and a plurality of alignment holes located outside the pattern region;
identifying the plurality of alignment holes in the fine metal mask, and tensioning the fine metal mask on the mesh frame using a tension device according to the identified alignment holes, and a mask plate is formed by the fine metal mask and the mesh frame;
providing a display substrate including a pixel region and a plurality of alignment marks, wherein the pixel region corresponds to the pattern region in the fine metal mask, and the position of each of the plurality of alignment marks in the display substrate corresponds to the position of the corresponding one of the plurality of alignment holes in the fine metal mask;
placing the mask plate on the display substrate, and adjusting the position of the fine metal mask so that the plurality of alignment holes in the fine metal mask are aligned with the position of the corresponding one of the plurality of alignment marks in the display substrate, respectively; and
performing evaporation for an assembly consisting of the mask plate and the display substrate using an evaporation source,
wherein the plurality of alignment holes comprises:
a R alignment hole for evaporating red pixel,
a G alignment hole for evaporating green pixel, and
a B alignment hole for evaporating blue pixel,
wherein the R alignment hole and the G alignment hole are disposed side by side in a first direction, and the B alignment hole is disposed at a same side of the R alignment hole and the G alignment hole in the first direction.

15. The alignment method of a fine metal mask for evaporation of claim 14, wherein the method comprises providing a plurality of fine metal masks, wherein the pattern region in each fine metal mask has different pixel pattern, and each fine metal mask is used to form pixels of single color on the display substrate during evaporation.

16. The alignment method of a fine metal mask for evaporation of claim 14, wherein the size of the alignment marks is smaller than the opening size of the alignment holes.

17. The alignment method of a fine metal mask for evaporation of claim 16, wherein the step of adjusting the position of the fine metal mask so that the plurality of alignment holes in the fine metal mask are aligned with the position of the corresponding one of the plurality of alignment marks in the display substrate respectively comprises:
adjusting the position of the fine metal mask so that each of the plurality of alignment marks in the display substrate is located at the central position of the opening of the corresponding one of the plurality of alignment holes in the fine metal mask.

* * * * *